United States Patent
Liu et al.

(10) Patent No.: US 11,217,324 B2
(45) Date of Patent: Jan. 4, 2022

(54) VALIDATING DATA IN STORAGE SYSTEMS

(71) Applicant: EMC IP Holding Company LLC, Hopkinton, MA (US)

(72) Inventors: Yousheng Liu, Beijing (CN); Lifeng Yang, Beijing (CN); Ruiyong Jia, Beijing (CN); Xinlei Xu, Beijing (CN); Jian Gao, Beijing (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/265,113

(22) Filed: Feb. 1, 2019

(65) Prior Publication Data

US 2019/0244675 A1  Aug. 8, 2019

(51) Int. Cl.
*G11C 29/38* (2006.01)
*G11C 29/44* (2006.01)
*G11C 29/52* (2006.01)
*G11C 29/00* (2006.01)

(52) U.S. Cl.
CPC ............ *G11C 29/38* (2013.01); *G11C 29/44* (2013.01); *G11C 29/52* (2013.01)

(58) Field of Classification Search
None
See application file for complete search history.

(56) References Cited

U.S. PATENT DOCUMENTS

| | | | | |
|---|---|---|---|---|
| 6,938,188 B1* | 8/2005 | Kelleher | ............ | G06F 11/221 714/43 |
| 2001/0042230 A1* | 11/2001 | Williams | .......... | G11B 20/1816 714/703 |
| 2004/0015762 A1* | 1/2004 | Klotz | ................. | G06F 11/2294 714/742 |
| 2010/0042773 A1* | 2/2010 | Yeh | .................... | G06F 12/0868 711/103 |
| 2017/0060674 A1* | 3/2017 | Nazari | ............... | G06F 11/1004 |
| 2019/0179687 A1* | 6/2019 | Wilkinson | ......... | G06F 11/0727 |

* cited by examiner

*Primary Examiner* — Mujtaba M Chaudry
(74) *Attorney, Agent, or Firm* — Krishnendu Gupta; Lesley Leonessa

(57) ABSTRACT

A method is used in validating data in a storage system. The method writes host data to the storage system during processing of a host I/O operation, where the host is in communication with the storage system. The storage system writes host data and test data associated with the host data to a storage device of the storage system. The method reads the host data and the test data from the storage device for validating the host data, and evaluates the test data to determine whether the host data has been written correctly by the storage system to the storage device. Upon determining that the host data has not been written correctly by the storage system to the storage device due to a failure, the method evaluates the test data to determine a cause of the failure.

20 Claims, 5 Drawing Sheets

VALIDATING DATA IN STORAGE SYSTEMS

RELATED APPLICATIONS

This application claim priority from Chinese Patent Application Number CN 201810104857.6, filed on Feb. 2, 2018 at the State Intellectual Property Office, China, titled "VALIDATING DATA IN STORAGE SYSTEMS" the contents of which is herein incorporated by reference in its entirety.

BACKGROUND

Technical Field

This application relates to validating data in storage systems.

Description of Related Art

Computer systems may include different resources used by one or more host processors. Resources and host processors in a computer system may be interconnected by one or more communication connections. These resources may include, for example, data storage devices such as those included in the data storage systems manufactured by EMC Corporation. These data storage systems may be coupled to one or more host processors and provide storage services to each host processor. Multiple data storage systems from one or more different vendors may be connected and may provide common data storage for one or more host processors in a computer system.

A host processor may perform a variety of data processing tasks and operations using the data storage system. For example, a host processor may perform basic system Input/Output (I/O) operations in connection with data requests, such as data read and write operations.

Host processor systems may store and retrieve data using a storage device containing a plurality of host interface units, disk drives, and disk interface units. Such storage devices are provided, for example, by EMC Corporation of Hopkinton, Mass. The host systems access the storage device through a plurality of channels provided therewith. Host systems provide data and access control information through the channels to the storage device and storage device provides data to the host systems also through the channels. The host systems do not address the disk drives of the storage device directly, but rather, access what appears to the host systems as a plurality of logical disk units, logical devices, or logical volumes. The logical disk units may or may not correspond to the actual disk drives. Allowing multiple host systems to access the single storage device unit allows the host systems to share data stored therein.

In connection with data storage, a variety of different technologies may be used. Data may be stored, for example, on different types of disk devices and/or flash memory devices. The data storage environment may define multiple storage tiers in which each tier includes physical devices or drives of varying technologies. The physical devices of a data storage system, such as a data storage array (or "storage array"), may be used to store data for multiple applications.

Data storage systems are arrangements of hardware and software that typically include multiple storage processors coupled to arrays of non-volatile storage devices, such as magnetic disk drives, electronic flash drives, and/or optical drives. The storage processors service I/O operations that arrive from host machines. The received I/O operations specify storage objects that are to be written, read, created, or deleted. The storage processors run software that manages incoming I/O operations and performs various data processing tasks to organize and secure the host data stored on the non-volatile storage devices.

SUMMARY OF THE INVENTION

In accordance with one aspect of the invention is a method is used in validating data in a storage system. The method writes host data to the storage system during processing of a host I/O operation, where the host is in communication with the storage system. The method writes host data and test data associated with the host data to a storage device of the storage system. The method reads the host data and the test data from the storage device for validating the host data, and evaluates the test data to determine whether the host data has been written correctly by the storage system to the storage device.

In accordance with another aspect of the invention, a system is used in in validating data in a storage system. The system comprises a processor configured to write host data to the storage system during processing of a host I/O operation, where the host is in communication with the storage system. The system writes host data and test data associated with the host data to a storage device of the storage system. The system reads the host data and the test data from the storage device for validating the host data, and evaluates the test data to determine whether the host data has been written correctly by the storage system to the storage device.

In accordance with another aspect of the invention, a computer program product comprising a computer readable medium is encoded with computer executable program code. The code enables execution across one or more processors for validating data in a storage system. The code writes host data to the storage system during processing of a host I/O operation, where the host is in communication with the storage system. The code writes host data and test data associated with the host data to a storage device of the storage system. The code reads the host data and the test data from the storage device for validating the host data, and evaluates the test data to determine whether the host data has been written correctly by the storage system to the storage device.

BRIEF DESCRIPTION OF THE DRAWINGS

Features and advantages of the present technique will become more apparent from the following detailed description of exemplary embodiments thereof taken in conjunction with the accompanying drawings in which.

DETAILED DESCRIPTION OF EMBODIMENT(S)

Figure 1:
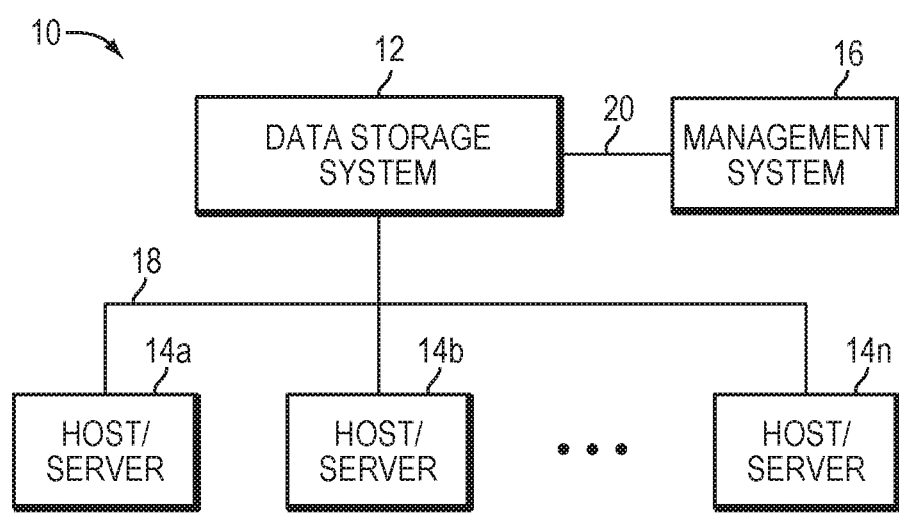
FIG. 1 is a simplified illustration of a computer system, in accordance with an embodiment of the present disclosure.

Described below is a technique for use in validating data in a storage system, which technique may be used to provide, among other things, writing host data to the storage system during processing of a host I/O operation, where the host is in communication with the storage system, writing host data and test data associated with the host data to a storage device of the storage system, reading the host data and the test data from the storage device for validating the host data, and evaluating the test data to determine whether the host data has been written correctly by the storage system to the storage device.

As described herein, in a storage system, the host performs the data verification test, for example, by executing the data validation test that runs on the host, and validates correctness of data written by the storage system. The host writes data to the storage system, and then reads the data from the storage system. The data read is compared to the data written. If they are the same, the test has been successful, and the system advances to the next test. If the data read is not the same as the data written, the test has failed, the testing process reports the failure, and the test process ceases.

In conventional technologies, the data verification test can only identify whether a comparison of data read from a storage device of a storage system and data written to the storage device fails, but cannot analyze the cause of such failure beyond reporting to a host that the comparison has failed. In such a conventional system, during the data verification test, host data is received from a host and written to the storage system, and stored in the storage system, but neither the storage system nor the cache produce any data related to the data verification test. Thus, no test failure data is provided by the storage system and/or the cache module or any other module of the storage system.

Conventional technologies cannot locate the cause of the failure. Conventional technologies fill all data fields with random data, and cannot provide data associated with internal states of the storage system. Conventional technologies cannot provide data associated with a history of the failure. Typically, when a data validation test failure occurs, for example, when a host write operation writes host data incorrectly, the test failure does not only occur at one location. Often, one test failure spawns a cascade of subsequent failures, such as when the length of the host data is incorrectly written to the storage system. Thus, a single mis-compare can cause a whole sector to have incorrectly written data.

Conventional technologies of identifying data verification failures decrease performance. For example, adding a trace log in the I/O path to record and save the I/O processing history decreases performance, and cannot reproduce the necessary data if the trace log is added after a failure occurs. Conventional technologies to avoid adding a trace log involve setting the host to panic on error. However, a panic only saves the state of the storage system at the moment the panic occurs; a panic does not save processing history. Additionally, a panic that is triggered by the host after a failure may not capture the cache module's internal state at the moment of failure since the state may change when the host panics the storage system.

By contrast, in at least some implementations in accordance with the technique as described herein, storing information regarding internal states of a storage system and history of various event occurring during a host I/O operation received from a host enables the storage system and the host to efficiently validate whether host data written to the storage system has been written correctly. In at least some implementations in accordance with the technique as described herein, information (e.g. metadata) regarding host data received from a host is written to host specific fields and storage specific fields during at least one of these events: 1) when the host writes host data to a storage system and 2) when an internal state of the storage system changes. Further, in at least some implementations in accordance with the technique as described herein, host data read from the storage system and provided to the host includes host specific fields information which is then validated by the host instead of comparing the host data itself as compared in a conventional system. Further, in at least some implementations in accordance with the technique as described herein, if the verification of the host specific field information fails, the cause of the failure can be efficiently determined by evaluating storage system specific information associated with such host data. Thus, the current technique not only tests the correctness of data stored on a storage system, but also enables the storage system to efficiently locate the cause of a failure when data is incorrectly written to the storage system.

In at least some implementations in accordance with the current technique as described herein, the use of the validating data in storage systems technique can provide one or more of the following advantages: improving efficiency of a data storage system by efficiently identifying a failure occurred when writing host data to a storage system, improving performance by providing an ability to identify the cause of a failure occurred when writing host data to a storage system, and improving diagnostic capability of a storage system by storing internal cache states and event history for analyzing a cause of a failure.

In contrast to conventional technologies, in at least some implementations in accordance with the current technique as described herein, a method validates data in a storage system. The method writes host data to the storage system during processing of a host I/O operation, where the host is in communication with the storage system. The storage system writes host data and test data associated with the host data to a storage device of the storage system. The method reads the host data and the test data from the storage device for validating the host data, and evaluates the test data to determine whether the host data has been written correctly by the storage system to the storage device.

In an example embodiment of the current technique the test data includes host specific information and storage system specific information.

In an example embodiment of the current technique, the host specific information includes information regarding the host I/O operation, where the information is written when the host data is processed by the storage system during execution of the host I/O operation.

In an example embodiment of the current technique, the storage system specific information includes information regarding internal states of the storage system components and historical information regarding a set of events occurring during processing of I/O operations in the storage system, where the storage system specific information is written when the host data is read from the storage device by the storage system.

In an example embodiment of the current technique, upon determining that the host data has not been written correctly by the storage system to the storage device due to a failure, the method evaluates the test data to determine a cause of the failure.

In an example embodiment of the current technique, when the method evaluates the test data to determine whether the host data has been written correctly by the storage system to the storage device, the method compares the host specific information of the test data with the host data and the test data read from the storage device.

In an example embodiment of the current technique, the test data associated with the host data comprises a history associated with at least one of a host write I/O operation and a host read I/O operation.

In an example embodiment of the current technique, the method transmits a test initiation command from the host to the storage system. The method receives, in response, by the host from the storage system, an acknowledgment of the test initiation command. In response to the acknowledgement, the method transitions the storage system into a test mode in which the storage system writes test data in addition to writing host data associated with a host I/O operation.

In an example embodiment of the current technique, the method stores the host data, and the test data on a storage sector of the storage device of the storage system.

Referring now to FIG. 1, shown is an example of an embodiment of a computer system that may be used in connection with performing the technique or techniques described herein. The computer system 10 includes one or more data storage systems 12 connected to host systems 14a-14n through communication medium 18. The system 10 also includes a management system 16 connected to one or more data storage systems 12 through communication medium 20. In this embodiment of the computer system 10, the management system 16, and the N servers or hosts 14a-14n may access the data storage systems 12, for example, in performing input/output (I/O) operations, data requests, and other operations. The communication medium 18 may be any one or more of a variety of networks or other type of communication connections as known to those skilled in the art. Each of the communication mediums 18 and 20 may be a network connection, bus, and/or other type of data link, such as hardwire or other connections known in the art. For example, the communication medium 18 may be the Internet, an intranet, network or other wireless or other hardwired connection(s) by which the host systems 14a-14n may access and communicate with the data storage systems 12, and may also communicate with other components (not shown) that may be included in the computer system 10. In at least one embodiment, the communication medium 20 may be a LAN connection and the communication medium 18 may be an iSCSI or fibre channel connection.

Each of the host systems 14a-14n and the data storage systems 12 included in the computer system 10 may be connected to the communication medium 18 by any one of a variety of connections as may be provided and supported in accordance with the type of communication medium 18. Similarly, the management system 16 may be connected to the communication medium 20 by any one of variety of connections in accordance with the type of communication medium 20. The processors included in the host computer systems 14a-14n and management system 16 may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage systems 12 are described herein in more detail, and may vary with each particular embodiment. Each of the host computers 14a-14n, the management system 16 and data storage systems may all be located at the same physical site, or, alternatively, may also be located in different physical locations. In connection with communication mediums 18 and 20, a variety of different communication protocols may be used such as SCSI, Fibre Channel, iSCSI, FCoE and the like. Some or all of the connections by which the hosts, management system, and data storage system may be connected to their respective communication medium may pass through other communication devices, such as a Connectrix or other switching equipment that may exist such as a phone line, a repeater, a multiplexer or even a satellite. In at least one embodiment, the hosts may communicate with the data storage systems over an iSCSI or fibre channel connection and the management system may communicate with the data storage systems over a separate network connection using TCP/IP. It should be noted that although FIG. 1 illustrates communications between the hosts and data storage systems being over a first connection, and communications between the management system and the data storage systems being over a second different connection, an embodiment may also use the same connection. The particular type and number of connections may vary in accordance with particulars of each embodiment.

Each of the host computer systems may perform different types of data operations in accordance with different types of tasks. In the embodiment of FIG. 1, any one of the host computers 14a-14n may issue a data request to the data storage systems 12 to perform a data operation. For example, an application executing on one of the host computers 14a-14n may perform a read or write operation resulting in one or more data requests to the data storage systems 12.

The management system 16 may be used in connection with management of the data storage systems 12. The management system 16 may include hardware and/or software components. The management system 16 may include one or more computer processors connected to one or more I/O devices such as, for example, a display or other output device, and an input device such as, for example, a keyboard, mouse, and the like. A data storage system manager may, for example, view information about a current storage volume configuration on a display device of the management system 16. The manager may also configure a data storage system, for example, by using management software to define a logical grouping of logically defined devices, referred to elsewhere herein as a storage group (SG), and restrict access to the logical group.

It should be noted that although element 12 is illustrated as a single data storage system, such as a single data storage array, element 12 may also represent, for example, multiple data storage arrays alone, or in combination with, other data storage devices, systems, appliances, and/or components having suitable connectivity, such as in a SAN, in an embodiment using the techniques herein. It should also be noted that an embodiment may include data storage arrays or other components from one or more vendors. In subsequent examples illustrated the techniques herein, reference may be made to a single data storage array by a vendor, such as by EMC Corporation of Hopkinton, Mass. However, as will be appreciated by those skilled in the art, the techniques herein are applicable for use with other data storage arrays by other vendors and with other components than as described herein for purposes of example.

An embodiment of the data storage systems 12 may include one or more data storage systems. Each of the data storage systems may include one or more data storage devices, such as disks. One or more data storage systems may be manufactured by one or more different vendors. Each of the data storage systems included in 12 may be inter-connected (not shown). Additionally, the data storage systems may also be connected to the host systems through any one or more communication connections that may vary with each particular embodiment and device in accordance with the different protocols used in a particular embodiment. The type of communication connection used may vary with certain system parameters and requirements, such as those related to bandwidth and throughput required in accordance with a rate of I/O requests as may be issued by the host computer systems, for example, to the data storage systems 12.

It should be noted that each of the data storage systems may operate stand-alone, or may also included as part of a storage area network (SAN) that includes, for example, other components such as other data storage systems.

Each of the data storage systems of element 12 may include a plurality of disk devices or volumes. The particular data storage systems and examples as described herein for purposes of illustration should not be construed as a limitation. Other types of commercially available data storage systems, as well as processors and hardware controlling access to these particular devices, may also be included in an embodiment.

Servers or host systems, such as 14a-14n, provide data and access control information through channels to the storage systems, and the storage systems may also provide data to the host systems also through the channels. The host systems do not address the disk drives of the storage systems directly, but rather access to data may be provided to one or more host systems from what the host systems view as a plurality of logical devices or logical volumes. The logical volumes may or may not correspond to the actual disk drives. For example, one or more logical volumes may reside on a single physical disk drive. Data in a single storage system may be accessed by multiple hosts allowing the hosts to share the data residing therein. A LUN (logical unit number) may be used to refer to one of the foregoing logically defined devices or volumes. An address map kept by the storage array may associate host system logical address with physical device address.

In such an embodiment in which element 12 of FIG. 1 is implemented using one or more data storage systems, each of the data storage systems may include code thereon for performing the techniques as described herein. In following paragraphs, reference may be made to a particular embodiment such as, for example, an embodiment in which element 12 of FIG. 1 includes a single data storage system, multiple data storage systems, a data storage system having multiple storage processors, and the like. However, it will be appreciated by those skilled in the art that this is for purposes of illustration and should not be construed as a limitation of the techniques herein. As will be appreciated by those skilled in the art, the data storage system 12 may also include other components than as described for purposes of illustrating the techniques herein.

Figure 2:
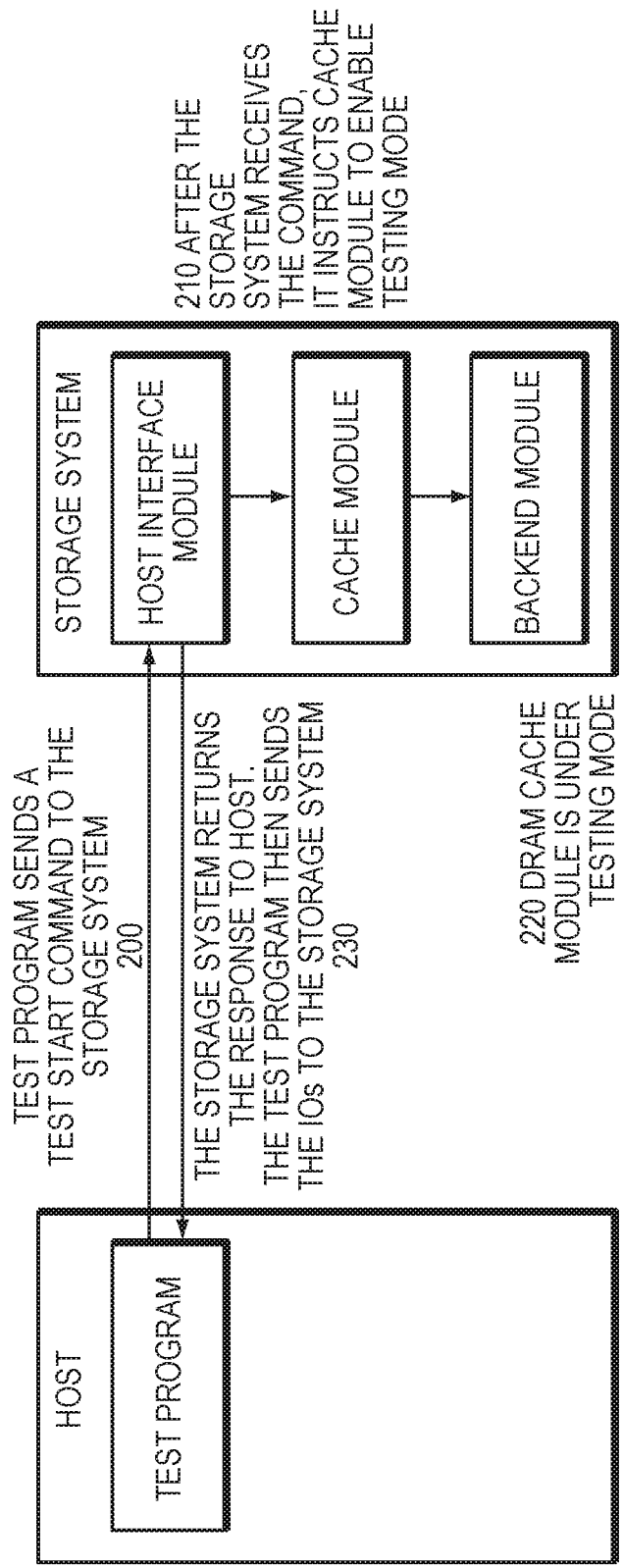
FIG. 2 is an example process to set the storage system into test mode, in accordance with an embodiment of the present disclosure.
Figure 4:
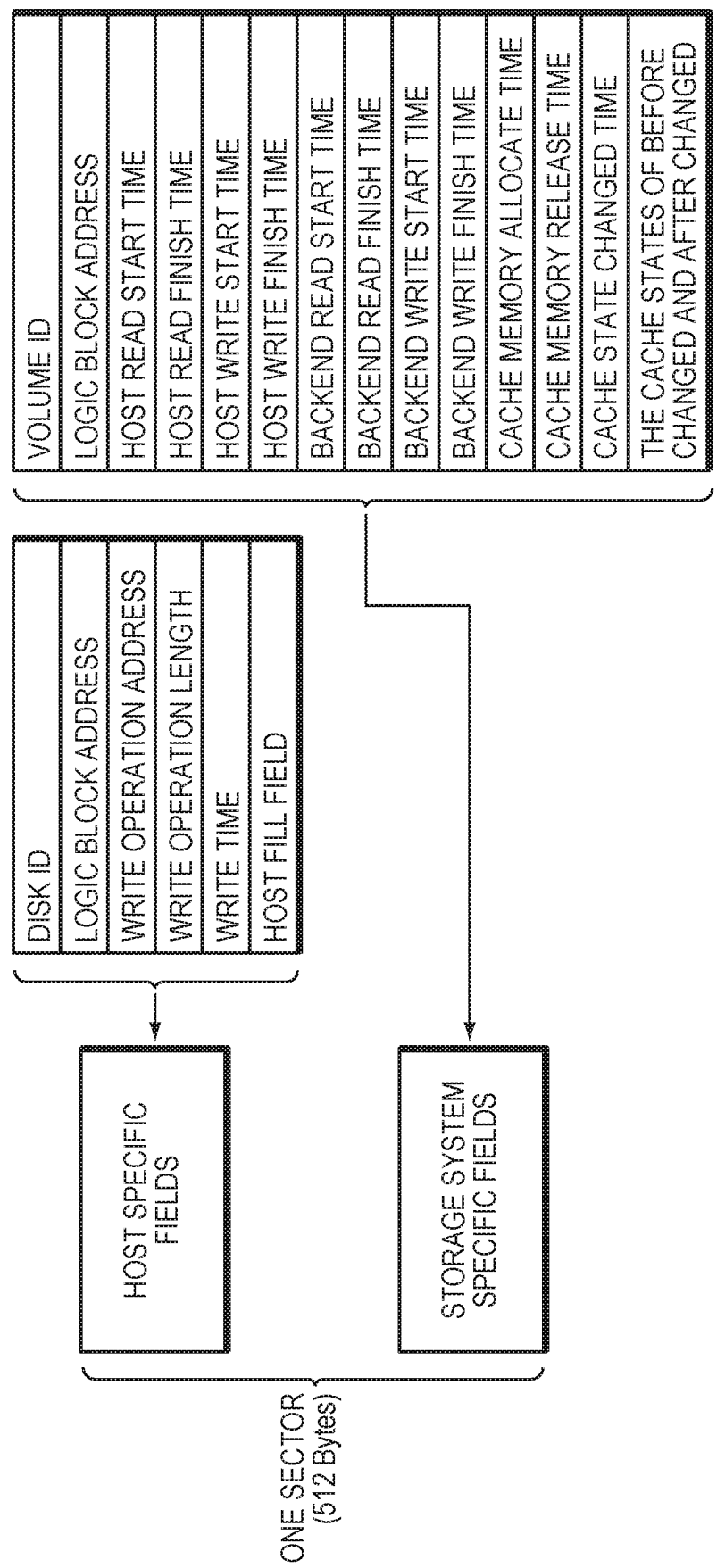
FIG. 4 is an example sector data layout, in accordance with an embodiment of the present disclosure.

FIG. 2 is an example process that places the storage system into a test mode to validate data in the storage system. During the test mode, the method writes test data such as the internal states and internal events history of the storage system in addition to writing host data provided by the host to the storage system as illustrated in FIG. 4. At Step 200, a test program, residing on the host, transmits a test initiation command from the host to the storage system. After the storage system receives the test initiation command, at Step 210, the storage system instructs the DRAM cache module to enable testing mode. At Step 220, the DRAM cache module is set to testing mode. In testing mode, when processing host data, the method fills information regarding the host data in the host specific information on the same storage sector on which the host data is written as illustrated in FIG. 4. In an example embodiment, the method writes storage system specific information when a state change occurs on the storage system and/or when a cache event occurs.

In an example embodiment, when the storage system is not in test mode, the host data sectors are not modified with any additional test data. In such a case, host data is passed from either the host to the backend storage device of the storage system during a write I/O operation or from the backend storage device to the host during a read I/O operation in addition to aching the host data in the cache module.

In Step 230, the storage system returns an acknowledgement of the test initiation command to the host. The host receives, from the storage system, an acknowledgment of the test initiation command, and in response, the host starts sending host I/O operations (such as read and write I/O requests) to the storage system to validate correctness of data written to the storage system. The storage system which has been transitioned into test mode writes the test data (such as host specific fields and storage specific fields) in addition to writing host data associated with a host I/O operation. In other words, the host initiates the host write operation and the host read operation.

Generally, a host sends host I/O operations to a storage system for reading data from the storage system or writing data to the storage system. Typically, for a host write operation (also referred to herein as "host write request"), the storage system receives the write I/O request from the host and stores host data sent by the host in a cache module temporarily. After storing the host data in the cache module, the storage system returns a write complete acknowledgement to the host indicating that the write I/O request has been completed. The storage system then at a later time flushes the host data stored in the cache module to a backend storage device. Similarly, when the storage system receives a host read operation (also referred to herein as "host read request") from the host, the storage system determines whether host data associated with the host read request has been cached in the cache module. If the data does not exists in the cache module, the storage system reads (or retrieves) host data associated with the host read request from a backend storage device. Then, a read complete acknowledgement is accordingly sent to the host along with the host data.

Figure 3:
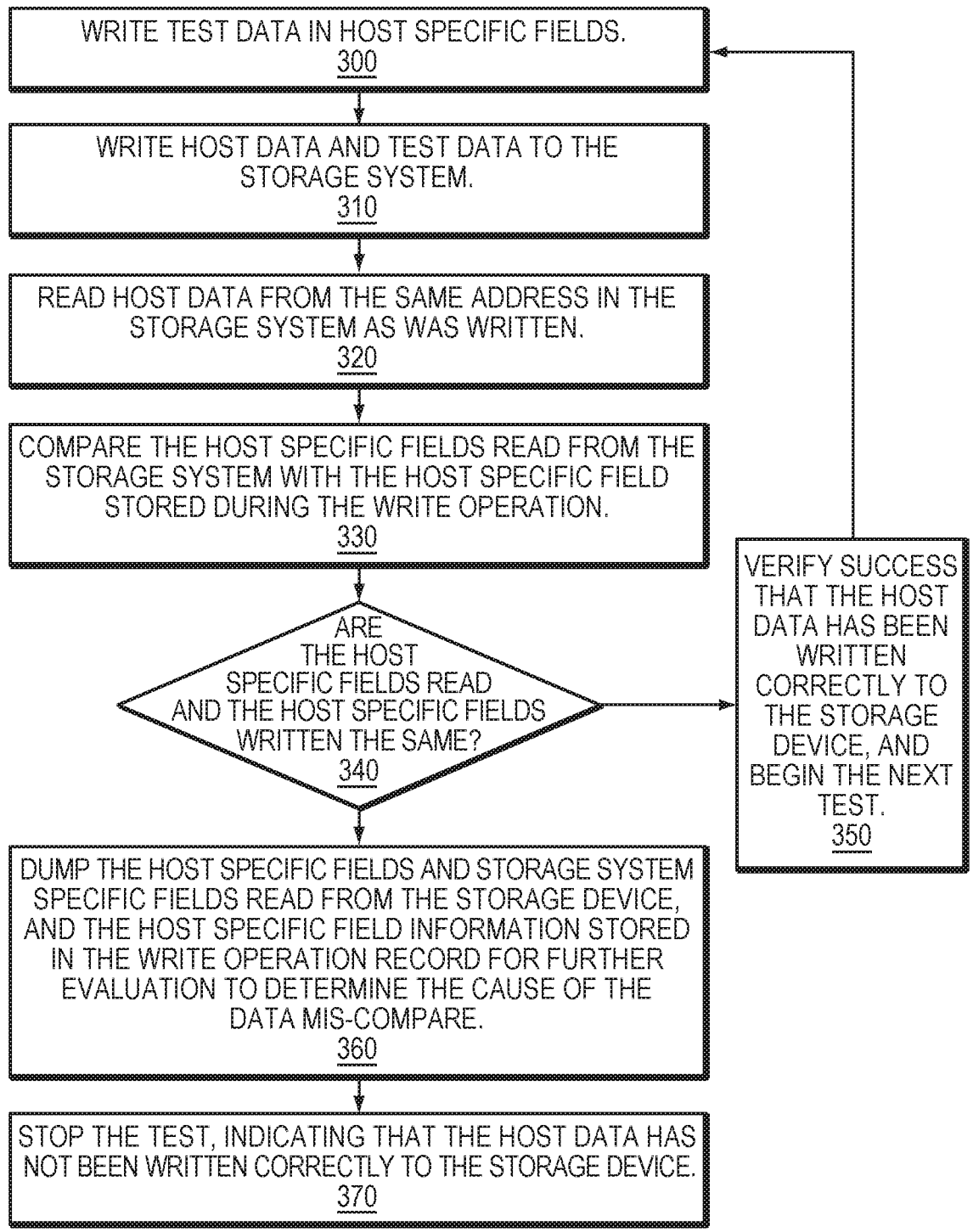
FIG. 3 is an example process to validate data in the storage system, in accordance with an embodiment of the present disclosure.

FIG. 3 is an example process to validate data in the storage system. In at least one embodiment of the current technique, a storage system receives a host write request to write host data from a host in communication with the storage system. At Step 300, the current method writes test data by filling the respective host specific fields for the host data as illustrated in FIG. 4. At Step 310, the method writes the host data along with the test data including the host specific fields filled out in step 300 to the storage system at a specific address on a storage device of the storage system during processing of the host write operation. Further, in addition to writing the host data and the test data to the storage device, information regarding the write operation transaction is temporarily saved in a write operation record (e.g., a journal, transaction log, cache) in the storage system. In an example embodiment, the method writes test data such as storage system specific information when a state change occurs on the storage system and/or when a cache event occurs. At Step 320, after the host data is written by the storage system, the method reads host data from the same address on the storage device from of the storage system in order to validate correctness of the host data. When the host data is read from the storage device, storage system specific information included in the test data associated with the host data is updated. Further, when the host data is read from the storage device, the test data associated with the host data which is written to the same storage sector is read along with the host data. At Step 330, the storage system compares the host specific fields included in the test data read from the storage device with the host specific field information temporarily stored in the write operation record previously during the write operation. If the host data read from the storage device and the host specific fields information stored in the write operation record are the same (Step 340), at Step 350, the method verifies a success indicating that host data has been written correctly to the storage device, and begins the next step. If the host data read from the storage device and the host specific fields information stored in the write operation record are not the same (Step 340), at Step 370, the method stops the test indicating a data mis-compare indicating that the host data has not been written correctly to the storage device. During a host data mis-compare, the method dumps the host data and the test data including the host specific fields and storage system specific fields read from the storage device and host specific field information stored in the write operation record for further evaluation to determine the cause of such data mis-compare (Step 360) as illustrated in FIG. 4. Thus, based on such data dumped by the storage system and made available to a user of the storage system enables the user to analyze the cause of the failure (data mis-compare) as it provides the user with events indicating changes to the state of data cached in the storage system.

FIG. 4 depicts an example sector data layout, in accordance with an embodiment of the current invention. In an example embodiment, during test mode, the method writes host specific information (for example, in the host specific fields) to a storage system during the processing of a host I/O operation, for example during a host write operation. The host specific information may include, for example, disk ID (for example LUN (Logical Unit Number) ID of a logical volume presented to the host by the storage system), logical block address (LBA) (i.e., the sector number of the current sector), write operation address (i.e., the first LBA of the host write operation), write operation length (i.e., the size of the write operation), write time (i.e., the time stamp of the host write operation) and/or host fill field (i.e., a time stamp).

In an example embodiment, the method writes storage system specific information (for example, in the storage system specific fields) when a state change occurs on the storage system and/or when a cache event occurs. The storage specific information may include, for example, volume ID, LBA, host read start time, host read finish time, host write start time, host write finish time, backend read start time, backend write start time, backend write finish time, cache memory allocate time, cache memory release time, cache state changed time, and/or the cache states of a cache i) before a cache state changes and ii) after a cache state changes.

Under test mode, the method writes the internal states and internal history associated with host I/O operations to the storage system specific information. Events associated with a cache module of a storage system may be triggered (or originate from or produced by) from a host, a backend storage device or the cache module itself. There may be four or more events from the host; host read started, host read finished, host write started, and host write finished. There may be four or more backend storage device events; backend read started, backend read finished, backend write started, and backed write finished. The internal cache events on the storage system may be cache buffer allocated from the storage system, release cache buffer to the storage system, and cache state changes. Further, for the cache module, there may be four or more cache states for a cache object stored in the cache module—whether the cache object is "invalid", "clean", "dirty" or "dirty prepared". When data is not cached in the cache module, the state of the data is considered "invalid". When the cache module receives a host write operation, and host data associated with the host write operation is being cached (stored) into the cache module, the state of the data or a cache object that stores that data is considered "dirty prepared". Further in such a case, when such host data is stored into the cache module, the state of the cache object becomes "dirty". Further, at a later time, when the data stored in the cache module is flushed (or written) to a backend storage device, or is read from the backend storage device, the state of the cache object becomes "clean".

In an example embodiment of the current technique, storage specific fields are updated or written to upon occurrence of internal events in the storage system. For example, after the cache data is allocated from the memory management system of the storage system, the current method fills the volume ID, LBA and cache memory allocate time fields in the storage system specific fields. In an example embodiment, when the cache data cached in the cache module is flushed to the backend storage device thereby releasing cache storage back to the memory management system, the current method fills in the cache memory release time field in the storage system specific fields. In an example embodiment, when state of a cache object stored in the cache module changes indicating a cache state change, the current method fills in the cache event changed time, as well as information regarding the cache states before the cache state changed and after the cache state changed in the storage system specific fields. In an example embodiment, when the cache module receives a host I/O operation (for example, host read request and/or host write request), the current method fills in the host read start time field, and the host write start time field of the storage specific fields with the current time stamp. In an example embodiment, before the cache module provides data to the host in response to receiving a host read request or acknowledges a host write request to the host, the current method fills in the host read start time and the host write finish time fields of the storage system specific fields accordingly. In an example embodiment, when the cache module begins to read the host data from the backend storage device or begins to write the host data to the backend storage device, the current method fills the host read finish time and host write finish time fields of the storage system specific fields accordingly. In an example embodiment, after the cache module finishes reading host data from the backend storage device or finishes writing host data to the backend storage device, the current method fills in the backend read time and backend write finish time fields of the storage system specific fields accordingly.

Figure 5:
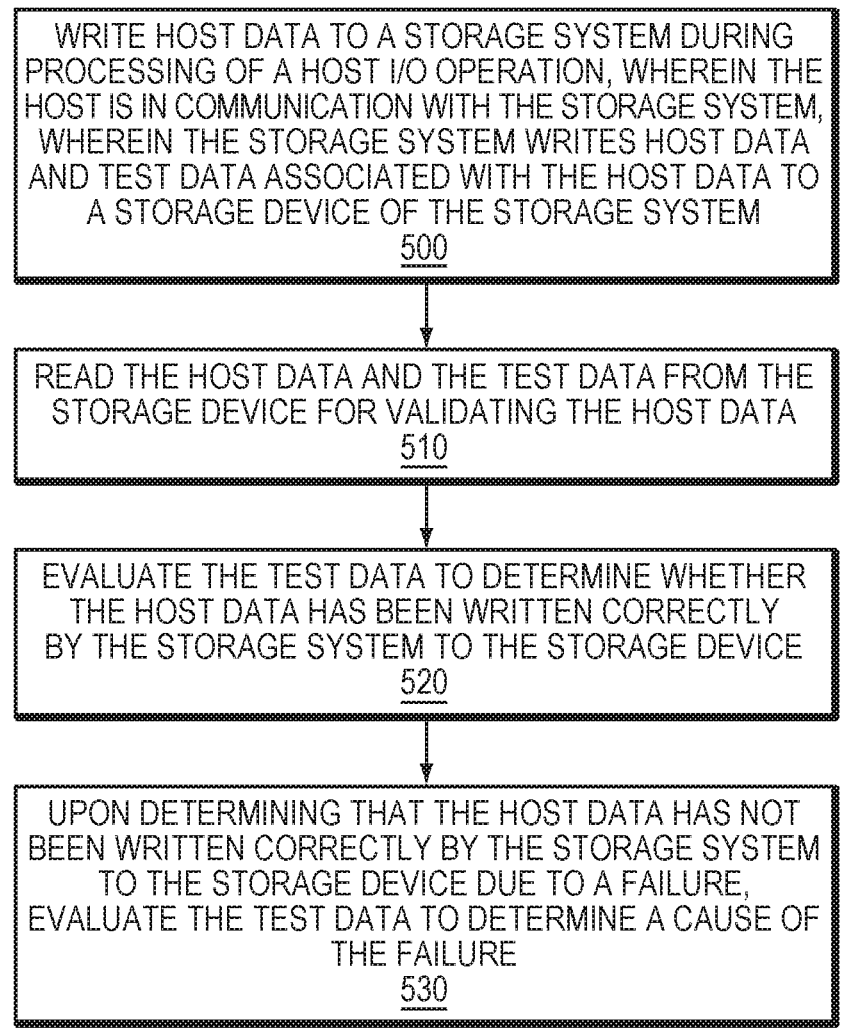
FIG. 5 is a flow diagram illustrating processes that may be used in connection with techniques disclosed herein.

Referring to FIG. 5, shown is a more detailed flow diagram illustrating validating data in a storage systems. As noted above, a host processor may perform a variety of data processing tasks and operations using the data storage system. Among the various data processing tasks performed by the storage processor is verifying or validating storage system data. A simplified data validation test system consists of a host and a storage system that is connected, for example, by Ethernet or Fiber Channel. The host performs the data validation test, for example, by executing the data validation test that runs on the host, and tests the storage system. For example, the host writes host data to the storage system, and then reads the host data from the address on the storage system to which the data was written. A comparison is performed to validate that the host data read is the same as the host data that was written.

The storage system consists of a host interface module, a cache module and a backend storage device. The host interface module is responsible for communicating with, and transmitting host data to, the host. During the data validation process, the host writes host data to the storage system. As part of this step, the write request (initiated by the host) and the host data (that is to be written to the storage system) is first transferred to the host interface module. When the host performs the host read operation to read the host data from the storage system, the host interface module transfers a read acknowledge response and the host data back to the host.

The cache module serves to improve read and write performance. During the data validation test, when the host data is written to the storage system, the host data is first stored in the cache module temporarily. In response, a write completed acknowledge response is returned to the host. At a later point in time, the storage system flushes the host data to the backend storage device. The backend storage device is responsible for storing host data in the storage medium. The backend storage devices are persistent storage mediums, such as hard disk drives (HDD) or solid-state drives (SSD) or flash drives.

During the data validation test, the storage system receives a read request from the host. The storage system first checks if the host data exists in the cache module. If the host data does not exist in the cache module, the storage system reads the host data from the backend storage device. Once the host data has been read from the backend storage device, the read completed acknowledge response is returned to the host. The host data is returned to the host for comparison with the host data that was written to the backend storage device.

With reference also to FIGS. 1-4, the method writes host data to a storage system during processing of a host I/O operation. The host is in communication with the storage system. The storage system writes host data and test data associated with the host data to a storage device of the storage system (Step 500). In an example embodiment of the current technique, the test data associated with the host data comprises a history associated with at least one of a host write I/O operation and a host read I/O operation. In an example embodiment of the current technique, the method stores the host data, and the test data on a storage sector of the storage device of the storage system. As noted above, a data mis-compare for data stored on a part of a storage sector of a backend storage device of a storage system indicating that host data sent by the host to the storage system does not matches with the data written by the storage system on the storage sector often indicates data mis-compare for other data stored on that whole storage sector, rather than just that portion of the sector. Thus it is advantageous to use a portion of storage space on which host data is usually stored to store test data associated with such host data such that the test data is accessed for evaluation when a host read operation reads the host data from the storage system as the test data is retrieved along with the host data. In an example embodiment, and as illustrated in FIG. 4, the portion of storage space on a storage sector used by the test data is divided into two parts; host specific fields, and storage system specific fields.

The current method reads the host data and the test data from the storage device (also referred to herein as "backend storage device") for validating the host data (Step 510). In an example embodiment, during the host read operation, the method fills in the storage system specific fields as illustrated in FIG. 4. In another example embodiment, the method fills in the storage system specific field whenever an internal state changes in the storage system, for example, a cache state change. In yet another example embodiment, during the host read operation, the method retrieves the information in the host specific fields, for example, the storage system returns the whole sector data to the host.

The method evaluates the test data to determine whether the host data has been written correctly by the storage system to the storage device (Step 520). In an example embodiment, when the method evaluates the test data to determine whether the host data has been written correctly by the storage system to the storage device, the method compares the host specific information of the test data read from the storage device with the host specific information saved on the storage system during the host write operation. For example, during the host write operation, the test data (containing the host specific information) is saved along with the host data on the storage device of the storage system. Additionally, the test data (containing the host specific information) is also temporarily saved on the storage system for performing the validation test at a later time. During the host read operation, the host specific information read from the storage device is compared with the host specific information that was saved temporarily on the storage system during the host write operation.

Upon determining that the host data has not been written correctly by the storage system to the storage device due to a failure (e.g., a software bug, a disk failure), the method evaluates the test data (e.g., storage system specific fields) to determine a cause of the failure (Step 530). As illustrated in FIG. 4, the user data sector that stores the host data also contains test data such as the events' state and internal history of the failure.

In an example embodiment, the test data includes a host specific information and a storage system specific information. In an example embodiment, the storage system specific information includes information regarding internal states of the storage system components and historical information regarding a set of events occurring during processing of I/O operations in the storage system. The storage system specific information is written when the host data is read from the storage device by the storage system.

In an example embodiment, the storage system specific information includes information regarding internal states of the storage system components and historical information regarding a set of events occurring during processing of I/O operations in the storage system. The storage system specific information is written when the host data is read from the storage device by the storage system.

In an example embodiment, the host specific information includes information regarding the host I/O operation, where the information is written when the host data is processed by the storage system during execution of the host I/O operation.

There are several advantages to embodiments disclosed herein. For example, the method exposes the storage systems' internal states and events' history using test data stored along with the host data and through the host read operation. When a data validation failure occurs, embodiments disclosed herein provide the storage system's internal states and events history. Thus, embodiments disclosed herein validate data, and also provide valuable failure information to more effectively locate the failure. The information captured in the host specific fields during a host write operation provide efficiency for the data validation test by validating data through the host specific fields rather than requiring validation of all the host data written to the storage system.

It should again be emphasized that the technique implementations described above are provided by way of illustration, and should not be construed as limiting the present invention to any specific embodiment or group of embodiments. For example, the invention can be implemented in other types of systems, using different arrangements of processing devices and processing operations. Also, message formats and communication protocols utilized may be varied in alternative embodiments. Moreover, various simplifying assumptions made above in the course of describing the illustrative embodiments should also be viewed as exemplary rather than as requirements or limitations of the invention. Numerous alternative embodiments within the scope of the appended claims will be readily apparent to those skilled in the art.

Furthermore, as will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

The flowchart and block diagrams in the FIGs illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method of validating data in a storage system, the method comprising:
   writing host data and test data to the storage system from a host during processing of a host I/O operation, wherein the host is in communication with the storage system, wherein the storage system writes the host data and the test data associated with the host data to a storage device of the storage system, wherein the test data, that enables identification of causes of failures, comprises host specific fields, storage specific fields, and wherein the storage system writes the host data and the test data, wherein a portion of the test data is modified, to the storage device of the storage system when an internal state changes in the storage system, wherein the test data comprises cache states, wherein when a state of a cache object stored in a cache changes, indicating a cache state change, a cache event change time, a cache state before the cache state change, and a cache state after the cache state change are stored in the storage specific field;
   reading the host data and the test data from the storage device for validating the host data; and
   evaluating the test data to determine whether the host data has been written correctly by the storage system to the storage device.

2. The method of claim 1, wherein the test data includes a host specific information and a storage system specific information.

3. The method of claim 2, wherein the host specific information includes information regarding the host I/O operation, wherein the said information is written when the host data is processed by the storage system during execution of the host I/O operation.

4. The method of claim 2, wherein the storage system specific information includes information regarding internal states of the storage system components and historical information regarding a set of events occurring during processing of I/O operations in the storage system, wherein the storage system specific information is written when the host data is read from the storage device by the storage system.

5. The method of claim 1, further comprising:
   upon determining that the host data has not been written correctly by the storage system to the storage device due to a failure, evaluating the test data to determine a cause of the failure.

6. The method of claim 2, wherein evaluating the test data to determine whether the host data has been written correctly by the storage system to the storage device further comprises comparing the host specific information of the test data with the host data and the test data read from the storage device.

7. The method of claim 1, wherein the test data associated with the host data comprises a history associated with at least one of a host write I/O operation and a host read I/O operation.

8. The method of claim 1, further comprising:
   transmitting a test initiation command from the host to the storage system;

receiving, in response, by the host from the storage system, an acknowledgment of the test initiation command; and in response to the acknowledgement, transitioning the storage system into a test mode in which the storage system writes test data in addition to writing host data associated with a host I/O operation.

9. The method of claim 1, further comprising:

storing the host data, and the test data on a storage sector of the storage device of the storage system.

10. A system for use in validating data in a storage system, the system comprising a processor configured to:

write host data and test data to the storage system from a host during processing of a host I/O operation, wherein the host is in communication with the storage system, wherein the storage system writes the host data and the test data associated with the host data to a storage device of the storage system, wherein the test data, that enables identification of causes of failures, comprises host specific fields, storage specific fields, and wherein the storage system writes the host data and the test data, wherein a portion of the test data is modified, to the storage device of the storage system when an internal state changes in the storage system, wherein the test data comprises cache states, wherein when a state of a cache object stored in a cache changes, indicating a cache state change, a cache event change time, a cache state before the cache state change, and a cache state after the cache state change are stored in the storage specific field;

read the host data and the test data from the storage device for validating the host data; and evaluate the test data to determine whether the host data has been written correctly by the storage system to the storage device.

11. The system of claim 10, wherein the test data includes a host specific information and a storage system specific information.

12. The system of claim 11, wherein the host specific information includes information regarding the host I/O operation, wherein the said information is written when the host data is processed by the storage system during execution of the host I/O operation.

13. The system of claim 11, wherein the storage system specific information includes information regarding internal states of the storage system components and historical information regarding a set of events occurring during processing of I/O operations in the storage system, wherein the storage system specific information is written when the host data is read from the storage device by the storage system.

14. The system of claim 10, further configured to:

upon determining that the host data has not been written correctly by the storage system to the storage device due to a failure, evaluate the test data to determine a cause of the failure.

15. The system of claim 11, wherein the processor configured to evaluate the test data to determine whether the host data has been written correctly by the storage system to the storage device is further configured to compare the host specific information of the test data with the host data and the test data read from the storage device.

16. The system of claim 10, wherein the test data associated with the host data comprises a history associated with at least one of a host write I/O operation and a host read I/O operation.

17. The system of claim 10, further configured to:

transmit a test initiation command from the host to the storage system;

receive, in response, by the host from the storage system, an acknowledgment of the test initiation command; and in response to the acknowledgement, transition the storage system into a test mode in which the storage system writes test data in addition to writing host data associated with a host I/O operation.

18. The system of claim 10, further configured to:

store the host data, and the test data on a storage sector of the storage device of the storage system.

19. A computer program product for validating data in a storage system, the computer program product comprising:

a computer readable storage medium having computer executable program code embodied therewith, the program code executable by a computer processor to:

write host data and test data to the storage system from a host during processing of a host I/O operation, wherein the host is in communication with the storage system, wherein the storage system writes the host data and the test data associated with the host data to a storage device of the storage system, wherein the test data, that enables identification of causes of failures, comprises host specific fields, storage specific fields, and wherein the storage system writes the host data and the test data, wherein a portion of the test data is modified, to the storage device of the storage system when an internal state changes in the storage system, wherein the test data comprises cache states, wherein when a state of a cache object stored in a cache changes, indicating a cache state change, a cache event change time, a cache state before the cache state change, and a cache state after the cache state change are stored in the storage specific field;

read the host data and the test data from the storage device for validating the host data; and evaluate the test data to determine whether the host data has been written correctly by the storage system to the storage device.

20. The computer program product of claim 19, wherein the test data includes a host specific information and a storage system specific information.

* * * * *